(12) United States Patent
Nagai (10) Patent No.: US 9,153,875 B2
(45) Date of Patent: Oct. 6, 2015

(54) HIGH-FREQUENCY MODULE

(71) Applicant: Murata Manufacturing Co., Ltd., Nagaokakyo-shi, Kyoto-fu (JP)

(72) Inventor: Tatsuro Nagai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 274 days.

(21) Appl. No.: 13/952,950

(22) Filed: Jul. 29, 2013

(65) Prior Publication Data

US 2013/0307749 A1    Nov. 21, 2013

Related U.S. Application Data

(63) Continuation of application No. PCT/JP2012/050698, filed on Jan. 16, 2012.

(30) Foreign Application Priority Data

Feb. 4, 2011   (JP) .................................. 2011-022407

(51) Int. Cl.
| | | |
|---|---|---|
| H01Q 21/00 | (2006.01) | |
| H01Q 21/28 | (2006.01) | |
| H03H 9/05 | (2006.01) | |
| H03H 9/64 | (2006.01) | |
| H03H 9/70 | (2006.01) | |
| H03H 9/72 | (2006.01) | |
| H04B 1/52 | (2015.01) | |
| H03H 9/00 | (2006.01) | |

(52) U.S. Cl.
CPC ............. *H01Q 21/28* (2013.01); *H03H 9/0571* (2013.01); *H03H 9/0576* (2013.01); *H03H 9/6483* (2013.01); *H03H 9/706* (2013.01); *H03H 9/725* (2013.01); *H04B 1/52* (2013.01); *H03H 9/0028* (2013.01)

(58) Field of Classification Search
CPC ............................ H01Q 21/065; H01Q 21/28
USPC ......................................................... 343/853
See application file for complete search history.

(56) References Cited

U.S. PATENT DOCUMENTS

| | | | |
|---|---|---|---|
| 6,380,823 B1 | 4/2002 | Ikata et al. | |
| 6,724,278 B1 | 4/2004 | Smith | |
| 2008/0231387 A1 | 9/2008 | Nagai | |
| 2008/0290965 A1 | 11/2008 | Pitschi et al. | |
| 2011/0156835 A1 | 6/2011 | Nagai | |
| 2011/0279193 A1 | 11/2011 | Furutani | |

FOREIGN PATENT DOCUMENTS

| | | |
|---|---|---|
| CN | 1333955 A | 1/2002 |
| JP | 2006-210994 A | 8/2006 |
| JP | 2009-517897 A | 4/2009 |
| WO | 2008/023510 A1 | 2/2008 |
| WO | 2010/032389 A1 | 3/2010 |
| WO | 2010/087307 A1 | 8/2010 |

OTHER PUBLICATIONS

Official Communication issued in International Patent Application No. PCT/JP2012/050698, mailed on Mar. 19, 2012.

*Primary Examiner* — Graham Smith
(74) *Attorney, Agent, or Firm* — Keating & Bennett, LLP (57) ABSTRACT

In a high-frequency module, an arrangement order of antenna terminals, transmission-side signal terminals, and reception-side signal terminals in a second direction corresponds to an arrangement order of antenna terminal electrodes, transmission-side terminal electrodes, and reception-side terminal electrodes in the second direction.

14 Claims, 7 Drawing Sheets

HIGH-FREQUENCY MODULE

BACKGROUND OF THE INVENTION

1. Field of the Invention

The present invention relates to a high-frequency module. In particular, the present invention relates to a high-frequency module in which a plurality of demultiplexer chips are mounted on a mounting substrate.

2. Description of the Related Art

High-frequency modules, in each of which a filter chip and a chip component are installed on a mounting substrate, have been used for cellular phones and the like. For example, in WO 2008/023510 A1, a high-frequency module is described in which a plurality of elastic wave filter chips and a plurality of chip inductors are mounted on a mounting substrate.

In recent years, communication systems have been shifting from a 2G system mainly including GSM (registered trademark) to a 3G system such as UMTS. So as to deal with this 3G system, it may also be considered that a plurality of demultiplexers chip such as duplexer chips are installed in a high-frequency module, each of the duplexer chips including a transmission filter unit and a reception filter unit.

However, when the high-frequency module is used in which the plural demultiplexer chips are installed, in some cases it is difficult to sufficiently enhance the sensitivity characteristic of a communication system.

SUMMARY OF THE INVENTION

In view of such a point, preferred embodiments of the present invention provide a high-frequency module in which a plurality of demultiplexer chips are installed, the high-frequency module preventing the deterioration of the sensitivity characteristic of a communication system.

A high-frequency module according to a preferred embodiment of the present invention includes a plurality of demultiplexing units. Each of the plural demultiplexing units includes an antenna terminal connected to an antenna, a transmission-side signal terminal, a reception-side signal terminal, a transmission filter unit, and a reception filter unit. The transmission filter unit is connected between the antenna terminal and the transmission-side signal terminal. The reception filter unit is connected between the antenna terminal and the reception-side signal terminal. The high-frequency module according to a preferred embodiment of the present invention includes a rectangular or substantially rectangular mounting substrate, a plurality of demultiplexer chips, a plurality of antenna-side mounting electrodes, a plurality of transmission-side mounting electrodes, a plurality of reception-side mounting electrodes, a plurality of antenna terminal electrodes, a plurality of transmission-side terminal electrodes, a plurality of reception-side terminal electrodes, a first wiring line, a second wiring line, and a third wiring line. The mounting substrate includes first and second long sides extending in a first direction and first and second short sides extending in a second direction perpendicular or substantially perpendicular to the first direction. The plural demultiplexer chips are mounted on the mounting surface of the mounting substrate. The demultiplexing unit is provided in each of the plural demultiplexer chips. The plural antenna-side mounting electrodes are provided on the mounting surface of the mounting substrate. Each of the plural antenna-side mounting electrodes is connected to the antenna terminal. The plural transmission-side mounting electrodes are provided on the mounting surface of the mounting substrate. Each of the plural transmission-side mounting electrodes is connected to the transmission-side signal terminal. The plural reception-side mounting electrodes are provided on the mounting surface of the mounting substrate. Each of the plural reception-side mounting electrodes is connected to the reception-side signal terminal. The plural antenna terminal electrodes are provided on the back surface of the mounting substrate. The plural transmission-side terminal electrodes are provided on the back surface of the mounting substrate. The plural reception-side terminal electrodes are provided on the back surface of the mounting substrate. The first wiring line is provided within the mounting substrate. The first wiring line connects the antenna-side mounting electrode and the antenna terminal electrode to each other. The second wiring line is provided within the mounting substrate. The second wiring line connects the transmission-side mounting electrode and the transmission-side terminal electrode to each other. The third wiring line is provided within the mounting substrate. The third wiring line connects the reception-side mounting electrode and the reception-side terminal electrode to each other. The plural demultiplexer chips are arranged in the first direction. In each of the plural demultiplexer chips, the antenna terminal, the transmission-side signal terminal, and the reception-side signal terminal are provided at different positions in the second direction. The plural antenna terminal electrodes, the plural transmission-side terminal electrodes, and the plural reception-side terminal electrodes are individually arranged in the first direction at different positions in the second direction. The arrangement order of the antenna terminal, the transmission-side signal terminal, and the reception-side signal terminal in the second direction corresponds to the arrangement order of the antenna terminal electrode, the transmission-side terminal electrode, and the reception-side terminal electrode in the second direction.

In a specific aspect of the high-frequency module according to a preferred embodiment of the present invention, the high-frequency module includes three of more of the demultiplexer chips.

In another specific aspect of the high-frequency module according to a preferred embodiment of the present invention, the demultiplexer chip further includes a ground terminal connected to at least one of the transmission filter unit and the reception filter unit. The high-frequency module further includes a ground mounting electrode provided on the mounting surface of the mounting substrate and connected to the ground terminal, a ground terminal electrode provided on the back surface of the mounting substrate, and a fourth wiring line that connects the ground mounting electrode and the ground terminal electrode to one another.

In another specific aspect of the high-frequency module according to a preferred embodiment of the present invention, on the back surface of the mounting substrate, a plurality of terminal electrodes are arranged in a matrix at regular intervals, the plural terminal electrodes including the plural antenna terminal electrodes, the plural transmission-side terminal electrodes, the plural reception-side terminal electrodes, and the ground terminal electrode.

In yet another specific aspect of the high-frequency module according to a preferred embodiment of the present invention, the high-frequency module further includes a chip component that defines at least one of an inductor and a capacitor connected to at least one of the reception filter unit and the transmission filter unit and is mounted on the mounting surface of the mounting substrate.

According to various preferred embodiments of the present invention, a high-frequency module includes a plurality of demultiplexer chips and prevents deterioration of the sensitivity characteristic of a communication system.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments in which the present invention is implemented will be described based on, as an example, a duplexer module 1 serving as a high-frequency module. In this regard, however, the duplexer module 1 is just an exemplification and is not limiting of the present invention. A high-frequency module according to the present invention is not limited to the duplexer module 1. It may be only necessary for the high-frequency module according to a preferred embodiment of the present invention to include a plurality of demultiplexer chips, and the high-frequency module according to a preferred embodiment of the present invention may also include, for example, a triplexer chip.

Figure 1:
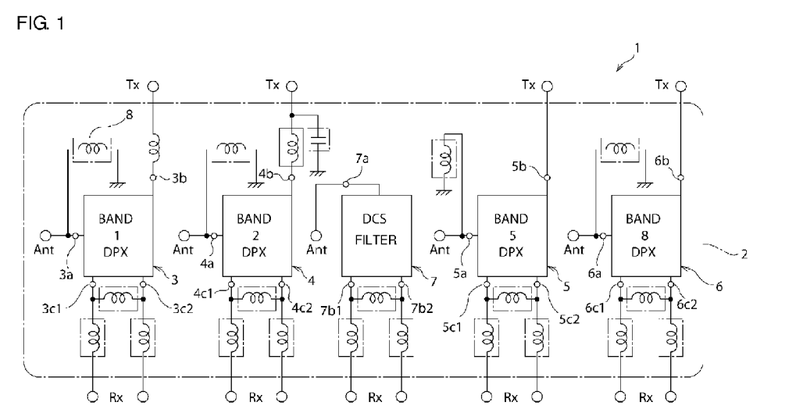
FIG. 1 is a schematic circuit diagram of a duplexer module according to a preferred embodiment of the present invention.
Figure 2:
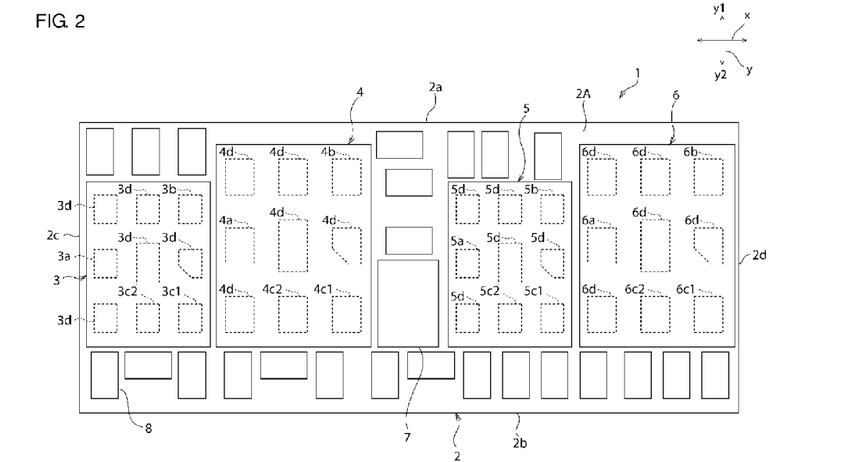
FIG. 2 is a schematic plan view of a duplexer module according to a preferred embodiment of the present invention.

The duplexer module 1 of the present preferred embodiment is, for example, a duplexer module installed in an RF circuit in a communication device such as a cellular phone. FIG. 1 is the schematic circuit diagram of the duplexer module 1 of the present preferred embodiment. FIG. 2 is the schematic plan view of the duplexer module 1 of the present preferred embodiment.

As illustrated in FIG. 1, the duplexer module 1 includes a mounting substrate 2, duplexer chips 3, 4, 5, and 6, a reception filter chip 7, and a plurality of chip components 8. The duplexer chips 3, 4, 5, and 6 and the reception filter chip 7 are filter components. The chip components 8 are matching elements such as an inductor and a capacitor. As illustrated in FIG. 2, the duplexer chips 3, 4, 5, and 6, the reception filter chip 7, and the chip components 8 are installed on the surface of the mounting substrate 2 using solder or the like.

The duplexer chip 3 is a duplexer corresponding to UMTS-BAND1. The transmission frequency band of the UMTS-BAND1 is 1920 MHz to 1980 MHz, and the reception frequency band thereof is 2110 MHz to 2170 MHz.

The duplexer chip 4 is a duplexer corresponding to UMTS-BAND2. The transmission frequency band of the UMTS-BAND2 is 1850 MHz to 1910 MHz, and the reception frequency band thereof is 1930 MHz to 1990 MHz.

The duplexer chip 5 is a duplexer corresponding to UMTS-BAND5. The transmission frequency band of the UMTS-BAND5 is 824 MHz to 849 MHz, and the reception frequency band thereof is 869 MHz to 894 MHz.

The duplexer chip 6 is a duplexer corresponding to UMTS-BAND8. The transmission frequency band of the UMTS-BAND8 is 880 MHz to 915 MHz, and the reception frequency band thereof is 925 MHz to 960 MHz.

The duplexer chips 3 to 6 preferably have the same or substantially the same configuration. Therefore, here, the duplexer chip 3 will be described in detail, and the description thereof will also be quoted to the duplexer chips 4 to 6.

Figure 3:
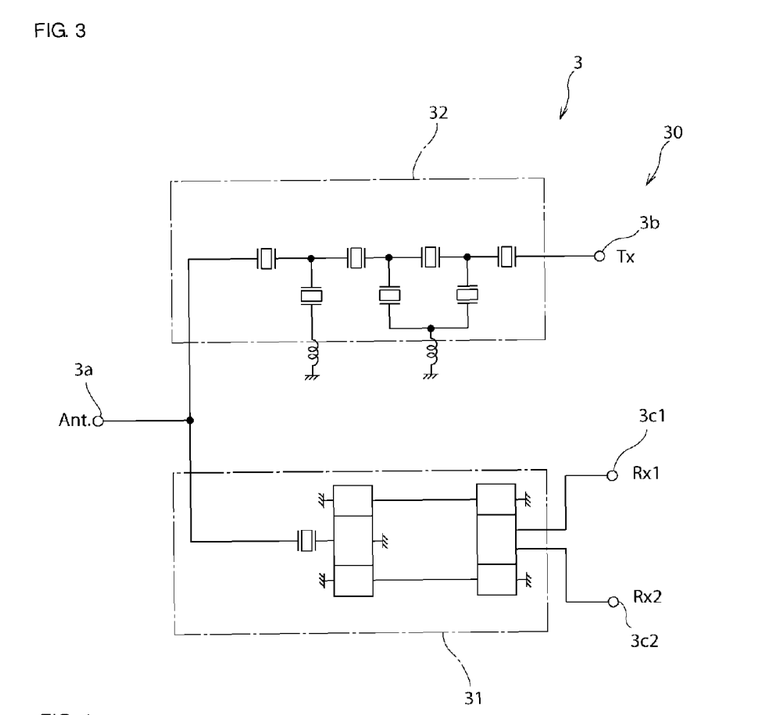
FIG. 3 is a schematic circuit diagram of a duplexer chip according to a preferred embodiment of the present invention.

FIG. 3 is the schematic circuit diagram of the duplexer chip 3. Next, the circuit configuration of the duplexer chip 3 will be described with reference to FIG. 3.

As illustrated in FIG. 3, the duplexer chip 3 includes a demultiplexing unit 30. The demultiplexing unit 30 includes an antenna terminal 3a connected to an antenna, a transmission-side signal terminal 3b, first and second reception-side signal terminals 3c1 and 3c2, and a ground terminal. The first and second reception-side signal terminals 3c1 and 3c2 are balanced signal terminals.

Between the antenna terminal 3a and the first and second reception-side signal terminals 3c1 and 3c2, a reception filter unit 31 is connected. In the present preferred embodiment, the reception filter unit 31 preferably is a longitudinally coupled resonator-type elastic wave filter unit having a balanced-unbalanced transforming function. In addition, in preferred embodiments of the present invention, the term "elastic wave" includes a surface acoustic wave, a boundary acoustic waves, and a bulk acoustic wave.

Between the antenna terminal 3a and the transmission-side signal terminal 3b, a transmission filter unit 32 is connected. In the present preferred embodiment, the transmission filter unit 32 preferably is a ladder-type elastic wave filter unit.

In the same way, the duplexer chip 4 also includes an antenna terminal 4a, a transmission-side signal terminal 4b, reception-side signal terminals 4c1 and 4c2, and a ground terminal 4d. Between the antenna terminal 4a and the transmission-side signal terminal 4b, a transmission filter unit is connected that preferably has the same or substantially the same configuration as the transmission filter unit 32. Between the antenna terminal 4a and the reception-side signal terminals 4c1 and 4c2, a reception filter unit is connected that preferably has the same or substantially the same configuration as the reception filter unit 31.

In the same way, the duplexer chip 5 also includes an antenna terminal 5a, a transmission-side signal terminal 5b, reception-side signal terminals 5c1 and 5c2, and a ground terminal 5d. Between the antenna terminal 5a and the transmission-side signal terminal 5b, a transmission filter unit is connected that preferably has the same or substantially the same configuration as the transmission filter unit 32. Between the antenna terminal 5a and the reception-side signal terminals 5c1 and 5c2, a reception filter unit is connected that preferably has the same or substantially the same configuration as the reception filter unit 31.

In the same way, the duplexer chip 6 also includes an antenna terminal 6a, a transmission-side signal terminal 6b, reception-side signal terminals 6c1 and 6c2, and a ground terminal 6d. Between the antenna terminal 6a and the transmission-side signal terminal 6b, a transmission filter unit is connected that preferably has the same or substantially the same configuration as the transmission filter unit 32. Between the antenna terminal 6a and the reception-side signal terminals 6c1 and 6c2, a reception filter unit is connected that preferably has the same or substantially the same configuration as the reception filter unit 31.

Figure 4:
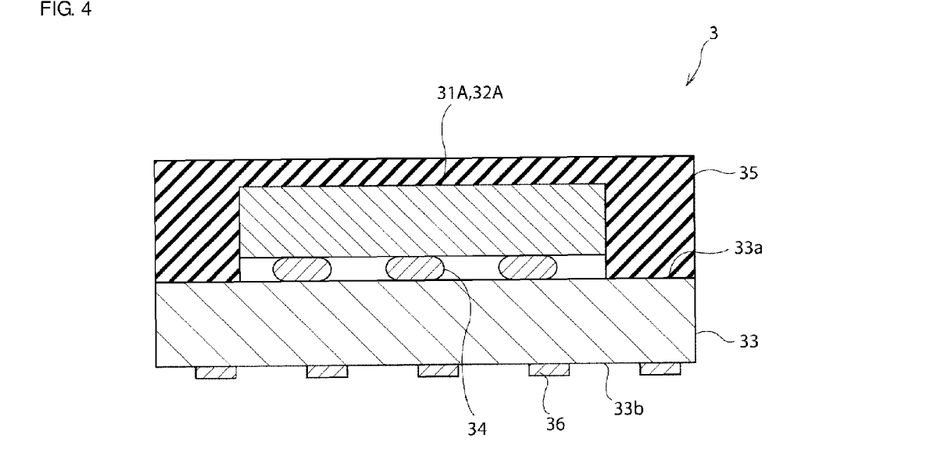
FIG. 4 is a schematic cross-sectional view of a duplexer chip according to a preferred embodiment of the present invention.

FIG. 4 is the schematic cross-sectional view of the duplexer chip 3. Next, the specific configuration of the duplexer chip 3 will be described with reference to FIG. 4.

As illustrated in FIG. 4, the duplexer chip 3 includes a wiring substrate 33, a reception-side elastic wave filter chip 31A in which the reception filter unit 31 is provided, and a transmission-side elastic wave filter chip 32A in which the transmission filter unit 32 is provided. The reception-side elastic wave filter chip 31A and the transmission-side elastic wave filter chip 32A are flip-chip mounted on the die-attach surface 33a of the wiring substrate 33 via a bump 34. On the die-attach surface 33a of the wiring substrate 33, a sealing resin 35 is arranged so as to cover the reception-side elastic wave filter chip 31A and the transmission-side elastic wave filter chip 32A. On the other hand, on the back surface 33b of the wiring substrate 33, a back-surface terminal 36 is provided. In addition, the wiring substrate 33 may be a printed wiring multilayer substrate containing a resin, or a ceramic multilayer substrate, for example.

Figure 5:
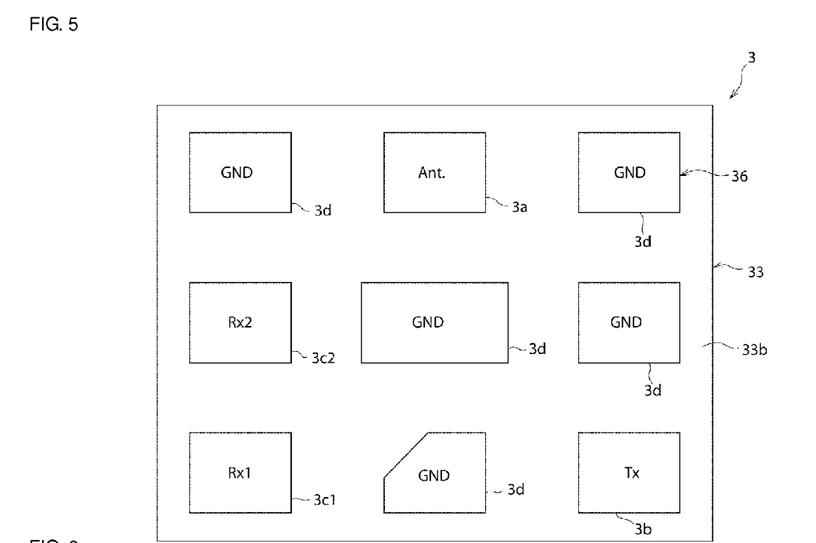
FIG. 5 is a transparent plan view illustrating a back-surface terminal of a duplexer chip according to a preferred embodiment of the present invention.

FIG. 5 is a transparent plan view illustrating the back-surface terminal 36 of the duplexer chip 3 in the duplexer module 1 of the present preferred embodiment. In addition, FIG. 5 illustrates a state where the wiring substrate 33 is seen through from a side on which the reception-side elastic wave filter chip 31A and the transmission-side elastic wave filter chip 32A are installed. The back-surface terminal 36 includes the antenna terminal 3a, the transmission-side signal terminal 3b, the reception-side signal terminals 3c1 and 3c2, and a ground terminal 3d. The ground terminal 3d is a terminal connecting the reception filter unit 31 and the transmission filter unit 32 to a ground.

In the same way as the duplexer chip 3, the reception filter chip 7 preferably is a CSP-type elastic wave device. The reception filter chip 7 includes an input terminal 7a, output terminals 7b1 and 7b2, and a reception filter unit connected between the input terminal 7a and the output terminals 7b1 and 7b2. This reception filter unit in the reception filter chip 7 is a reception-side interstage filter corresponding to DCS. The reception frequency band of the DCS is 1805 MHz to 1880 MHz. The reception filter unit in the reception filter chip 7 preferably is a longitudinally coupled resonator-type elastic wave filter having a balanced-unbalanced transforming function.

As illustrated in FIG. 2, the mounting substrate 2 preferably has a rectangular or substantially rectangular shape. The mounting substrate 2 includes first and second long sides 2a and 2b extending in an x direction and first and second short sides 2c and 2d extending in a y direction perpendicular or substantially perpendicular to the x direction. On the mounting surface 2A of the mounting substrate 2, the duplexer chips 3 to 6 and reception filter chip 7 are mounted to be arranged in the x direction serving as a direction in which the long sides 2a and 2b extend.

Figure 6:
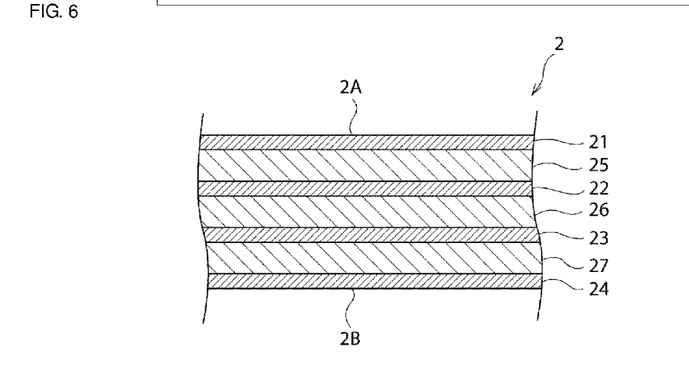
FIG. 6 is a diagrammatic cross-sectional view of a mounting substrate 2.

The mounting substrate 2 is a printed wiring multilayer substrate. As illustrated in FIG. 6, the mounting substrate 2 includes first to fourth electrode layers 21 to 24 and first to third dielectric layers 25 to 27. In the mounting substrate 2, these electrode layers 21 to 24 and dielectric layers 25 to 27 are alternately laminated. Specifically, extending from a mounting surface 2A side to a back surface 2B side, the first electrode layer 21, the first dielectric layer 25, the second electrode layer 22, the second dielectric layer 26, the third electrode layer 23, the third dielectric layer 27, and the fourth electrode layer 24 are laminated in this order.

The first, second, third and fourth electrode layers 21 to 24 may be made of, for example, metal such as Cu. Each of the first, second and third dielectric layers 25 to 27 may be made of, for example, a resin.

Figure 7:
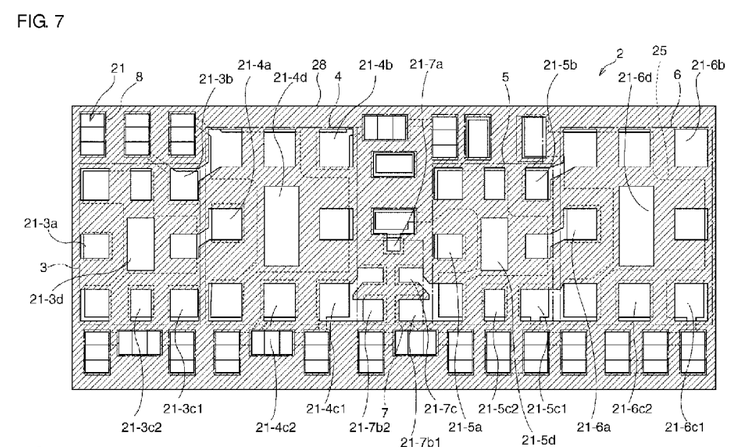
FIG. 7 is a schematic transparent plan view of a first electrode layer 21 and a first dielectric layer 25 in the mounting substrate 2 of a duplexer module according to a preferred embodiment of the present invention.
Figure 8:
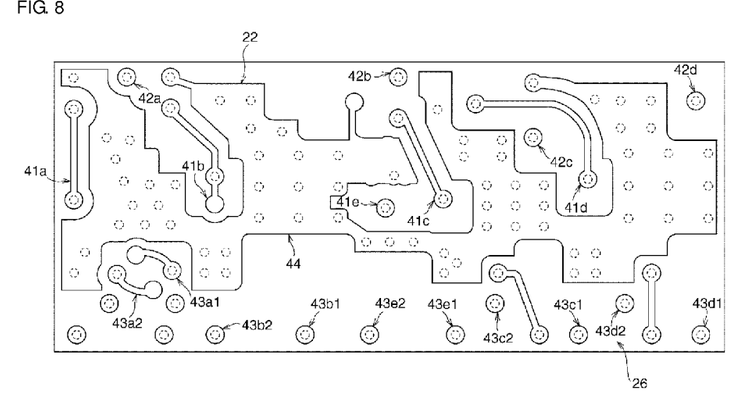
FIG. 8 is a schematic transparent plan view of a second electrode layer 22 and a second dielectric layer 26 in the mounting substrate 2 of a duplexer module according to a preferred embodiment of the present invention.
Figure 9:
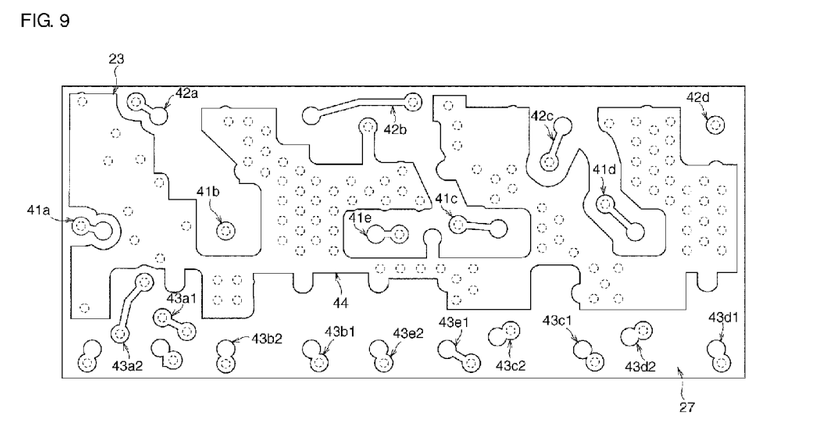
FIG. 9 is a schematic transparent plan view of a third electrode layer 23 and a third dielectric layer 27 in the mounting substrate 2 of a duplexer module according to a preferred embodiment of the present invention.
Figure 10:
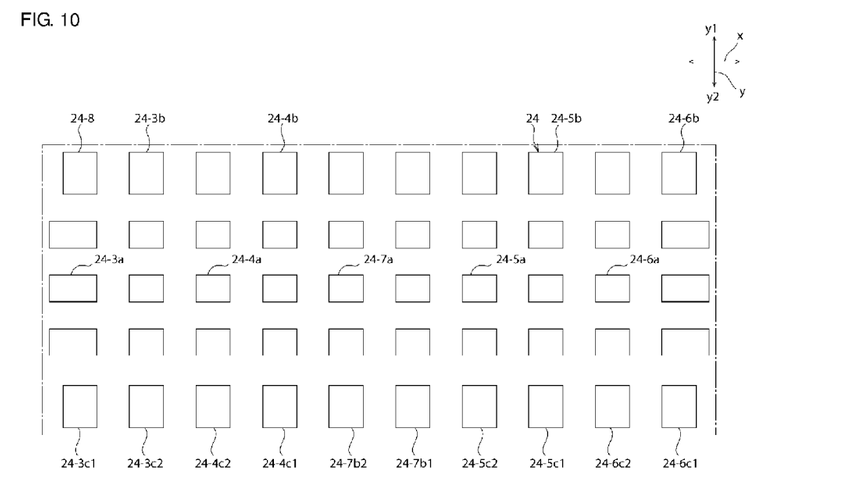
FIG. 10 is a schematic transparent plan view of a fourth electrode layer 24 in the mounting substrate 2 of a duplexer module according to a preferred embodiment of the present invention.

FIG. 7 is the schematic transparent plan view of the first electrode layer 21 and the first dielectric layer 25 in the mounting substrate 2 in the duplexer module 1 of the present preferred embodiment. FIG. 8 is the schematic transparent plan view of the second electrode layer 22 and the second dielectric layer 26 in the mounting substrate 2 in the duplexer module 1 of the present preferred embodiment. FIG. 9 is the schematic transparent plan view of the third electrode layer 23 and the third dielectric layer 27 in the mounting substrate 2 in the duplexer module 1 of the present preferred embodiment. FIG. 10 is the schematic transparent plan view of the fourth electrode layer 24 in the mounting substrate 2 in the duplexer module 1 of the present preferred embodiment. FIG. 7 to FIG. 10 illustrate states where the mounting substrate 2 is seen through from a side on which the duplexer chips 3, 4, 5, and 6, the reception filter chip 7, and the chip component 8 are installed.

As illustrated in FIG. 7, the first electrode layer 21 is a mounting electrode layer including a plurality of mounting electrodes. In the mounting substrate 2, a resist layer 28 is arranged so as to cover a portion of the first electrode layer 21. In FIG. 7, using dashed-dotted lines, regions are illustrated in which the duplexer chips 3, 4, 5, and 6, the reception filter chip 7, and the chip component 8 are installed.

As illustrated in FIG. 7, the first electrode layer 21 includes mounting electrodes 21-3a, 21-3b, 21-3c1, 21-3c2, 21-3d, 21-4a, 21-4b, 21-4c1, 21-4c2, 21-4d, 21-5a, 21-5b, 21-5c1, 21-5c2, 21-5d, 21-6a, 21-6b, 21-6c1, 21-6c2, 21-6d, 21-7a, 21-7b1, 21-7b2, and 21-7c.

The mounting electrode 21-3a is an antenna-side mounting electrode connected to the antenna terminal 3a in the duplexer chip 3. The mounting electrode 21-4a is an antenna-side mounting electrode connected to the antenna terminal 4a in the duplexer chip 4. The mounting electrode 21-5a is an antenna-side mounting electrode connected to the antenna terminal 5a in the duplexer chip 5. The mounting electrode 21-6a is an antenna-side mounting electrode connected to the antenna terminal 6a in the duplexer chip 6.

The mounting electrode 21-3b is a transmission-side mounting electrode connected to the transmission-side signal terminal 3b in the duplexer chip 3. The mounting electrode 21-4b is a transmission-side mounting electrode connected to the transmission-side signal terminal 4b in the duplexer chip 4. The mounting electrode 21-5b is a transmission-side mounting electrode connected to the transmission-side signal terminal 5b in the duplexer chip 5. The mounting electrode 21-6b is a transmission-side mounting electrode connected to the transmission-side signal terminal 6b in the duplexer chip 6.

The mounting electrode 21-3c1 is a reception-side mounting electrode connected to the reception-side signal terminal 3c1 in the duplexer chip 3. The mounting electrode 21-3c2 is a reception-side mounting electrode connected to the reception-side signal terminal 3c2 in the duplexer chip 3. The mounting electrode 21-4c1 is a reception-side mounting electrode connected to the reception-side signal terminal 4c1 in the duplexer chip 4. The mounting electrode 21-4c2 is a reception-side mounting electrode connected to the reception-side signal terminal 4c2 in the duplexer chip 4. The mounting electrode 21-5c1 is a reception-side mounting electrode connected to the reception-side signal terminal 5c1 in the duplexer chip 5. The mounting electrode 21-5c2 is a reception-side mounting electrode connected to the reception-side signal terminal 5c2 in the duplexer chip 5. The mounting electrode 21-6c1 is a reception-side mounting electrode connected to the reception-side signal terminal 6c1 in the duplexer chip 6. The mounting electrode 21-6c2 is a reception-side mounting electrode connected to the reception-side signal terminal 6c2 in the duplexer chip 6.

The mounting electrode 21-3d is a ground mounting electrode connected to the ground terminal 3d in the duplexer chip 3. The mounting electrode 21-4d is a ground mounting electrode connected to the ground terminal 4d in the duplexer chip 4. The mounting electrode 21-5d is a ground mounting electrode connected to the ground terminal 5d in the duplexer chip 5. The mounting electrode 21-6d is a ground mounting electrode connected to the ground terminal 6d in the duplexer chip 6.

The mounting electrode 21-7a is connected to the input terminal 7a in the reception filter chip 7. The mounting electrode 21-7b1 is connected to the output terminal 7b1 in the reception filter chip 7. The mounting electrode 21-7b2 is connected to the output terminal 7b2 in the reception filter chip 7. The mounting electrode 21-7c is connected to the ground terminal 7c in the reception filter chip 7.

The other mounting electrodes in the first electrode layer 21 are connected to terminal electrodes in the chip components 8.

The mounting electrodes 21-3a, 21-3b, 21-3c1, 21-3c2, 21-3d, 21-4a, 21-4b, 21-4c1, 21-4c2, 21-4d, 21-5a, 21-5b, 21-5c1, 21-5c2, 21-5d, 21-6a, 21-6b, 21-6c1, 21-6c2, 21-6d, 21-7a, 21-7b1, 21-7b2, and 21-7c are connected to terminal electrodes 24-3a, 24-3b, 24-3c1, 24-3c2, 24-4a, 24-4b, 24-4c1, 24-4c2, 24-5a, 24-5b, 24-5c1, 24-5c2, 24-6a, 24-6b, 24-6c1, 24-6c2, 24-7a, 24-7b1, 24-7b2, and 24-8 provided on the back surface 2B of the mounting substrate 2, through wiring lines defined by hole electrodes indicated by circles in the second and third electrode layers 22 and 23 and FIG. 8 to FIG. 10.

Specifically, the antenna-side mounting electrode 21-3a is connected to the antenna terminal electrode 24-3a through a first wiring line 41a. The antenna-side mounting electrode 21-4a is connected to the antenna terminal electrode 24-4a through a first wiring line 41b. The antenna-side mounting electrode 21-5a is connected to the antenna terminal electrode 24-5a through a first wiring line 41c. The antenna-side mounting electrode 21-6a is connected to the antenna terminal electrode 24-6a through a first wiring line 41d. The input terminal 7a is connected to the input terminal electrode 24-7a through a first wiring line 41e.

The transmission-side mounting electrode 21-3b is connected to the transmission-side terminal electrode 24-3b through a second wiring line 42a. The transmission-side mounting electrode 21-4b is connected to the transmission-side terminal electrode 24-4b through a second wiring line 42b. The transmission-side mounting electrode 21-5b is connected to the transmission-side terminal electrode 24-5b through a second wiring line 42c. The transmission-side mounting electrode 21-6b is connected to the transmission-side terminal electrode 24-6b through a second wiring line 42d.

The reception-side mounting electrode 21-3c1 is connected to the reception-side terminal electrode 24-3c1 through a third wiring line 43a1. The reception-side mounting electrode 21-3c2 is connected to the reception-side terminal electrode 24-3c2 through a third wiring line 43a2. The reception-side mounting electrode 21-4c1 is connected to the reception-side terminal electrode 24-4c1 through a third wiring line 43b1. The reception-side mounting electrode 21-4c2 is connected to the reception-side terminal electrode 24-4c2 through a third wiring line 43b2. The reception-side mounting electrode 21-5c1 is connected to the reception-side terminal electrode 24-5c1 through a third wiring line 43c1. The reception-side mounting electrode 21-5c2 is connected to the reception-side terminal electrode 24-5c2 through a third wiring line 43c2. The reception-side mounting electrode 21-6c1 is connected to the reception-side terminal electrode 24-6c1 through a third wiring line 43d1. The reception-side mounting electrode 21-6c2 is connected to the reception-side terminal electrode 24-6c2 through a third wiring line 43d2. The output terminals 7b1 and 7b2 are connected to the mounting electrodes 24-7b1 and 24-7b2 through wiring lines 43e1 and 43e2.

The ground mounting electrodes 21-3d, 21-4d, 21-5d, and 21-6d are connected to a plurality of the ground terminal electrodes 24-8 through a fourth wiring line 44. These terminal electrodes 24-3a, 24-3b, 24-3c1, 24-3c2, 24-4a, 24-4b, 24-4c1, 24-4c2, 24-5a, 24-5b, 24-5c1, 24-5c2, 24-6a, 24-6b, 24-6c1, 24-6c2, 24-7a, 24-7b1, 24-7b2, and 24-8 are arranged in a matrix at regular intervals on the back surface 2B of the mounting substrate 2.

In the present preferred embodiment, as illustrated in FIG. 2, in the individual duplexer chips 3 to 6, the antenna terminals 3a, 4a, 5a, and 6a, the transmission-side signal terminals 3b, 4b, 5b, and 6b, the reception-side signal terminals 3c1, 3c2, 4c1, 4c2, 5c1, 5c2, 6c1, and 6c2 are provided in different positions in the y direction, which is a direction in which the short sides 2c and 2d extend. In addition, on the back surface 2B, the antenna terminal electrodes 24-3a, 24-4a, 24-5a, and 24-6a, the transmission-side terminal electrodes 24-3b, 24-4b, 24-5b, and 24-6b, and the reception-side terminal electrodes 24-3c1, 24-3c2, 24-4c1, 24-4c2, 24-5c1, 24-5c2, 24-6c1, and 24-6c2 are also provided at different positions in the y direction. In the back surface 2B, the antenna terminal electrodes 24-3a, 24-4a, 24-5a, and 24-6a, the transmission-side terminal electrodes 24-3b, 24-4b, 24-5b, and 24-6b, and the reception-side terminal electrodes 24-3c1, 24-3c2, 24-4c1, 24-4c2, 24-5c1, 24-5c2, 24-6c1, and 24-6c2 are individually arranged in the x direction serving as a direction in which the long sides 2a and 2b extend.

In addition, the arrangement order of the antenna terminals 3a, 4a, 5a, and 6a, the transmission-side signal terminals 3b, 4b, 5b, and 6b, and the reception-side signal terminals 3c1, 3c2, 4c1, 4c2, 5c1, 5c2, 6c1, and 6c2 in the y direction corresponds to the arrangement order of the antenna terminal electrodes 24-3a, 24-4a, 24-5a, and 24-6a, the transmission-side terminal electrodes 24-3b, 24-4b, 24-5b, and 24-6b, and the reception-side terminal electrodes 24-3c1, 24-3c2, 24-4c1, 24-4c2, 24-5c1, 24-5c2, 24-6c1, and 24-6c2 in the y direction.

In other words, the transmission-side signal terminals 3b, 4b, 5b, and 6b and the transmission-side terminal electrodes 24-3b, 24-4b, 24-5b, and 24-6b, connected to each other, are located farthest on a y1 side in the y direction. The reception-side signal terminals 3c1, 3c2, 4c1, 4c2, 5c1, 5c2, 6c1, and 6c2 and the reception-side terminal electrodes 24-3c1, 24-3c2, 24-4c1, 24-4c2, 24-5c1, 24-5c2, 24-6c1, and 24-6c2, connected to each other, are located farthest on a y2 side in the y direction. The antenna terminals 3a, 4a, 5a, and 6a and the antenna terminal electrodes 24-3a, 24-4a, 24-5a, and 24-6a, connected to each other, are located in a center in the y direction. Therefore, it is possible to shorten the first wiring lines 41a to 41d, the second wiring lines 42a to 42d, and the third wiring lines 43a to 43d. Accordingly, it is possible to reduce parasitic capacitance generated due to the first wiring lines 41a to 41d, the second wiring lines 42a to 42d, and the third wiring lines 43a to 43d.

Figure 11:
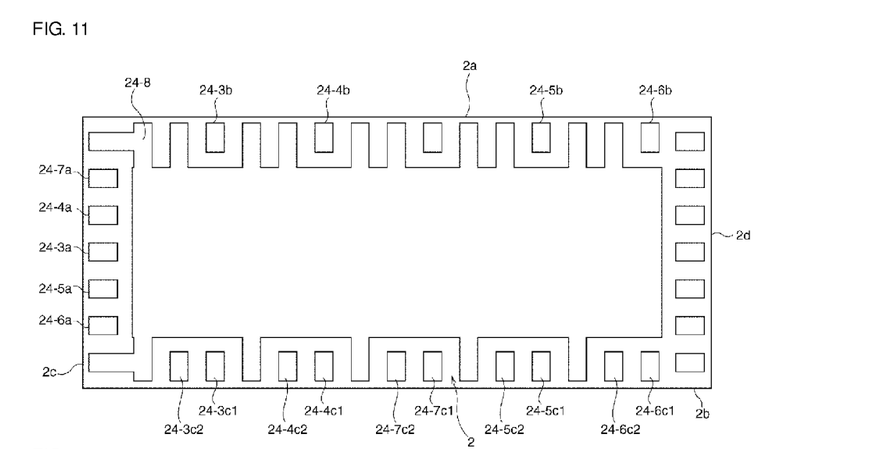
FIG. 11 is a schematic transparent plan view of a fourth electrode layer of a duplexer module of a comparative example.
Figure 12:
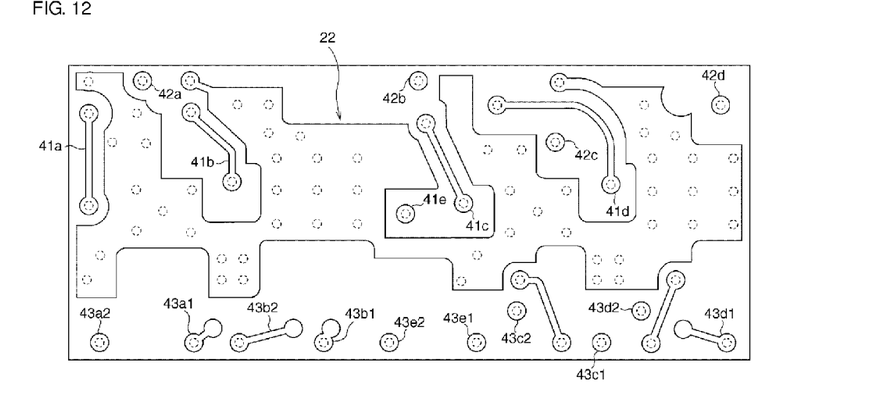
FIG. 12 is a schematic transparent plan view of a second electrode layer of a duplexer module of a comparative example.
Figure 13:
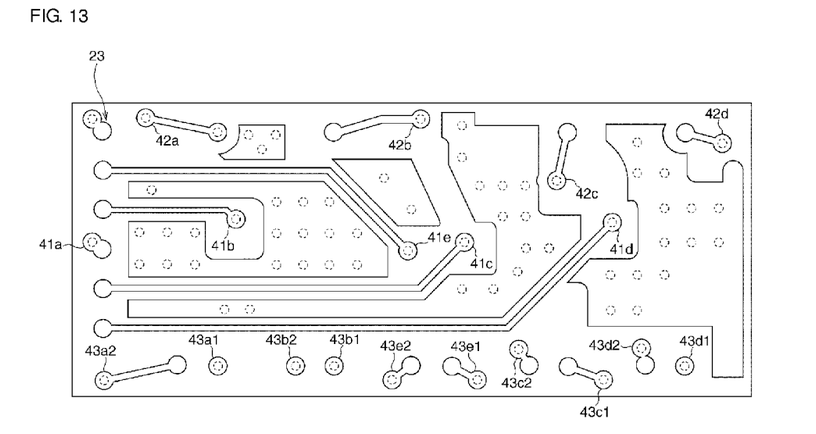
FIG. 13 is a schematic transparent plan view of a third electrode layer of a duplexer module of a comparative example.

On the other hand, when, for example, in such a way as a comparative example illustrated in FIG. 11 to FIG. 13, the antenna terminal electrodes 24-3a, 24-4a, 24-5a, and 24-6a are arranged along the first short side 2c, the transmission-side terminal electrodes 24-3b, 24-4b, 24-5b, and 24-6b are arranged along the first long side 2a, and the reception-side terminal electrodes 24-3c1, 24-3c2, 24-4c1, 24-4c2, 24-5c1, 24-5c2, 24-6c1, and 24-6c2 are arranged along the second long side 2b, the arrangement order of the antenna terminals 3a, 4a, 5a, and 6a, the transmission-side signal terminals 3b, 4b, 5b, and 6b, and the reception-side signal terminals 3c1, 3c2, 4c1, 4c2, 5c1, 5c2, 6c1, and 6c2 in the y direction does not correspond to the arrangement order of the antenna terminal electrodes 24-3a, 24-4a, 24-5a, and 24-6a, the transmission-side terminal electrodes 24-3b, 24-4b, 24-5b, and 24-6b, and the reception-side terminal electrodes 24-3c1, 24-3c2, 24-4c1, 24-4c2, 24-5c1, 24-5c2, 24-6c1, and 24-6c2 in the y direction. Therefore, the first wiring lines 41a to 41d, the second wiring lines 42a to 42d, and the third wiring lines 43a to 43d increase in length. Accordingly, large parasitic capacitance occurs due to the first wiring lines 41a to 41d, the second wiring lines 42a to 42d, and the third wiring lines 43a to 43d. In addition, since the first wiring lines 41a to 41d, the second wiring lines 42a to 42d, and the third wiring lines 43a to 43d increase in length, the characteristic impedance of the duplexer module greatly deviates. Therefore, a return loss in the pass band of the duplexer module becomes large.

On the other hand, in the present preferred embodiment, as described above, it is possible to shorten the first wiring lines 41a to 41d, the second wiring lines 42a to 42d, and the third wiring lines 43a to 43d. Therefore, it is possible to significantly reduce or prevent the deviation of the characteristic impedance of the duplexer module 1. Accordingly, it is possible to significantly reduce or prevent a return loss in the pass band of the duplexer module 1.

In addition, by disposing the terminal electrodes in a matrix in such a way as in the present preferred embodiment, it is possible to make each terminal electrode larger than the comparative example. Since, in the comparative example, it is necessary to concentrate the antenna terminal electrodes 24-3a, 24-4a, 24-5a, and 24-6a and the input terminal electrode 24-7a on the first short side 2c side of the mounting substrate 2, it is difficult to make each terminal electrode large. However, in the present preferred embodiment, since it is possible to dispose the antenna terminal electrodes 24-3a, 24-4a, 24-5a, and 24-6a and the input terminal electrode 24-7a in the center of the mounting substrate 2, it is possible to make each terminal electrode large and increase a distance between terminal electrodes. Accordingly, in the case of the duplexer module 1 of the present preferred embodiment, an advanced surface mount technology is unnecessary, and no parasitic capacitance occurs between terminal electrodes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a plurality of demultiplexing units each of which includes an antenna terminal connected to an antenna, a transmission-side signal terminal, a reception-side signal terminal, a transmission filter unit connected between the antenna terminal and the transmission-side signal terminal, and a reception filter unit connected between the antenna terminal and the reception-side signal terminal;
   a mounting substrate including first and second long sides extending in a first direction and first and second short sides extending in a second direction perpendicular or substantially perpendicular to the first direction and have a rectangular shape;
   a plurality of demultiplexer chips mounted on a mounting surface of the mounting substrate and in which the demultiplexing units are provided;
   a plurality of antenna-side mounting electrodes provided on the mounting surface of the mounting substrate and connected to the antenna terminals;
   a plurality of transmission-side mounting electrodes provided on the mounting surface of the mounting substrate and connected to the transmission-side signal terminals;
   a plurality of reception-side mounting electrodes provided on the mounting surface of the mounting substrate and connected to the reception-side signal terminals;
   a plurality of antenna terminal electrodes provided on a back surface of the mounting substrate;
   a plurality of transmission-side terminal electrodes provided on the back surface of the mounting substrate;
   a plurality of reception-side terminal electrodes provided on the back surface of the mounting substrate;
   a first wiring line provided within the mounting substrate and connect the antenna-side mounting electrode and the antenna terminal electrode to each other;
   a second wiring line provided within the mounting substrate and connect the transmission-side mounting electrode and the transmission-side terminal electrode to each other; and
   a third wiring line provided within the mounting substrate and connect the reception-side mounting electrode and the reception-side terminal electrode to each other; wherein
   the plurality of demultiplexer chips are arranged in the first direction;
   the antenna terminal, the transmission-side signal terminal, and the reception-side signal terminal are provided at different positions in the second direction in each of the plurality of demultiplexer chips;
   the plurality of antenna terminal electrodes, the plurality of transmission-side terminal electrodes, and the plurality of reception-side terminal electrodes are individually arranged in the first direction at different positions in the second direction; and
   an arrangement order of the antenna terminal, the transmission-side signal terminal, and the reception-side signal terminal in the second direction corresponds to an arrangement order of the antenna terminal electrode, the transmission-side terminal electrode, and the reception-side terminal electrode in the second direction.

2. The high-frequency module according to claim 1, wherein the plurality of demultiplexer chips includes at least three demultiplexer chips.

3. The high-frequency module according to claim 1, wherein
each of the plurality of demultiplexer chips further includes a ground terminal connected to at least one of the transmission filter unit and the reception filter unit; and
the high-frequency module further includes:
a ground mounting electrode provided on the mounting surface of the mounting substrate and connected to the ground terminal;
a ground terminal electrode provided on the back surface of the mounting substrate; and
a fourth wiring line arranged to connect the ground mounting electrode and the ground terminal electrode to one another.

4. The high-frequency module according to claim 3, wherein on the back surface of the mounting substrate, a plurality of terminal electrodes are arranged in a matrix at regular intervals, the plurality of terminal electrodes including the plurality of antenna terminal electrodes, the plurality of transmission-side terminal electrodes, the plurality of reception-side terminal electrodes, and the ground terminal electrode.

5. The high-frequency module according to claim 1, further comprising:
a chip component that defines at least one of an inductor and a capacitor connected to at least one of the reception filter unit and the transmission filter unit and is mounted on the mounting surface of the mounting substrate.

6. The high-frequency module according to claim 1, wherein one of the plurality of demultiplexer chips is configured such that a transmission frequency band is 1920 MHz to 1980 MHz, and a reception frequency band thereof is 2110 MHz to 2170 MHz.

7. The high-frequency module according to claim 1, wherein one of the plurality of demultiplexer chips is configured such that a transmission frequency band is 1850 MHz to 1910 MHz, and a reception frequency band thereof is 1930 MHz to 1990 MHz.

8. The high-frequency module according to claim 1, wherein one of the plurality of demultiplexer chips is configured such that a transmission frequency band is 824 MHz to 849 MHz, and a reception frequency band thereof is 869 MHz to 894 MHz.

9. The high-frequency module according to claim 1, wherein one of the plurality of demultiplexer chips is configured such that a transmission frequency band is 880 MHz to 915 MHz, and a reception frequency band thereof is 925 MHz to 960 MHz.

10. The high-frequency module according to claim 1, wherein the plurality of demultiplexer chips have a common configuration.

11. The high-frequency module according to claim 1, wherein the reception filter unit is a longitudinally coupled resonator-type elastic wave filter unit having a balanced-unbalanced transforming function.

12. The high-frequency module according to claim 1, wherein the transmission filter unit is a ladder-type elastic wave filter unit.

13. A communication device comprising the high-frequency module according to claim 1.

14. The communication device according to claim 13, wherein the communication device is a cellular phone.

* * * * *